(12) United States Patent
Shimamoto et al.

(10) Patent No.: US 6,583,023 B2
(45) Date of Patent: Jun. 24, 2003

(54) METHOD FOR MAKING SEMICONDUCTOR INTEGRATED CIRCUITS

(75) Inventors: Yasuhiro Shimamoto, Hachioji (JP); Hiroshi Miki, Tokyo (JP); Masahiko Hiratani, Akishima (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/118,887

(22) Filed: Apr. 10, 2002

(65) Prior Publication Data
US 2002/0151152 A1 Oct. 17, 2002

(30) Foreign Application Priority Data
Apr. 11, 2001 (JP) .................................... 2001-112159

(51) Int. Cl.⁷ .............................................. H01L 21/20
(52) U.S. Cl. .................................................... 438/398
(58) Field of Search ................................. 438/398, 665, 438/221, 255, 800

(56) References Cited

U.S. PATENT DOCUMENTS 6,509,246 B2 * 1/2003 Miki et al. .................. 438/398

* cited by examiner

*Primary Examiner*—Craig Thompson
(74) *Attorney, Agent, or Firm*—Antonelli, Terry, Stout & Kraus, LLP (57) ABSTRACT

A capacitor having an equivalent thickness of 3.0 nm or less, with a sufficient static capacitance and less leakage current in a reduced size, constituted by stacking an interfacial film 21 having a physical thickness of 2.5 nm or more for suppressing tunnel leakage current and a high dielectric film 22 comprising tantalum pentaoxide on lower electrode 19, 20 comprising rugged polycrystal silicon film, the interfacial film 21 comprising a nitride film formed by an LPCVD method, for example, from $Al_2O_3$, a mixed phase of $Al_2O_3$ and $SiO_2$, $ZrSiO_4$, $HfSiO_4$, a mixed phase of $Y_2O_3$ and $SiO_2$, and a mixed phase of $La_2O_3$ and $SiO_2$.

23 Claims, 9 Drawing Sheets

FIG.2A

THICKNESS OF TANTALUM PENTAOXIDE 8nm
THERMAL TREATMENT FOR
CRYSTALLIZATION RTO 750°C 5min

FIG.2B

THICKNESS OF TANTALUM PENTAOXIDE 8nm
THERMAL TREATMENT FOR
CRYSTALLIZATION RTO 750°C 5min

METHOD FOR MAKING SEMICONDUCTOR INTEGRATED CIRCUITS

BACKGROUND OF THE INVENTION

1. Field of the Invention

This invention concerns semiconductor integrated circuits and a fabrication method thereof and, more in particular, it relates to a technique effective to be applied to semiconductor integrated circuits having DRAM (Dynamic Random Access Memory).

2. Description of the Prior Art

DRAM is constituted by arranging memory cells each comprising a selection transistor and information storage capacitor (hereinafter referred to as a capacitor) connected therewith in a matrix form on a semiconductor substrate. For constituting DRAM of an increased capacitance, densification of the static capacitance of the memory cell capacitor is necessary. As the technique therefor Japanese Patent Laid-open No.HEI 06-244364, for example, discloses a method of using tantalum pentaoxide having a high dielectric constant for the dielectric film of the capacitor. In this conventional technique, a silicon nitride film is formed on the surface of polycrystal silicon as an electrode by a thermal nitridation method using ammonia to prevent oxidation of the electrode upon heat treatment of the tantalum pentaoxide film in an oxygen atmosphere. Further, Japanese Patent Laid-open No.HEI 11-26712, for example, discloses a conventional technique of forming semi-spherical silicon oxide crystal on the surface of a polycrystal silicon electrode, forming silicon nitride film and tantalum pentaoxide in the same manner to constitute a capacitor. According to the conventional technique, static capacitance can be enlarged due to high dielectric constant of tantalum pentaoxide and increase in the effective electrode surface with the semi-spherical silicon crystal.

SUMMARY OF THE INVENTION

The present inventors have made a study on the capacitor for use in DRAM for the semiconductor integrated circuits of enlarged capacitance such as DRAM of 256 Mbits or 1 Gbit.

In the capacitor process, when thermal nitridation was conducted at 800° C. using ammonia, oxidation of the silicon nitride film occurs during the heat treatment for crystallization of tantalum pentaoxide (800° C. in oxygen), to lower the capacitance of the capacitor. Generally, as the reference of the capacitance density of a capacitor, a film thickness equivalent to a silicon oxide film having a relative of 3.9 dielectric constant is used. Reduction of the equivalent thickness means increase in the capacitance density of the capacitor.

Figure 9:
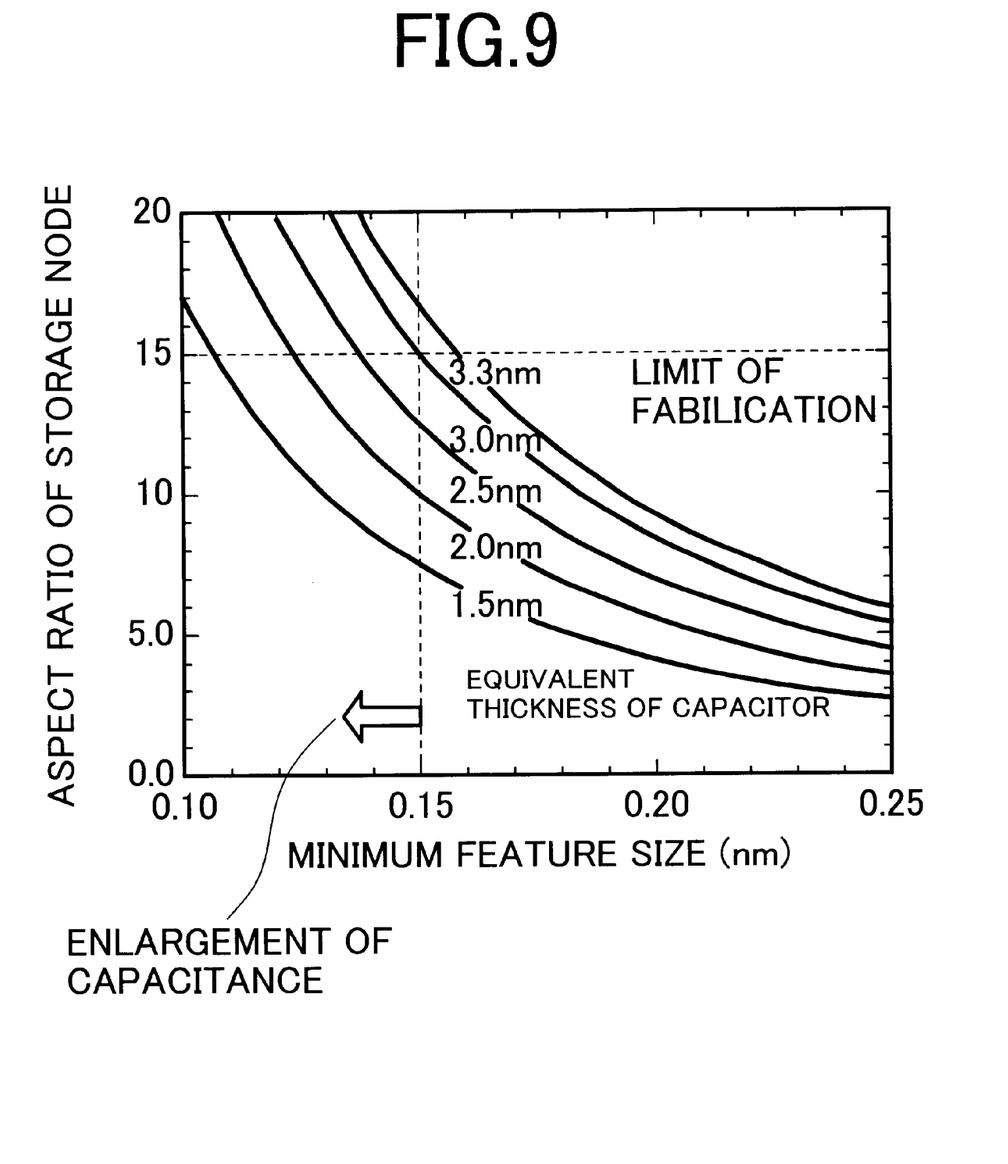
FIG. 9 is a graph showing an relation between the feature size of capacitors and an aspect ratio of a storage node for attaining the capacitance of 25 fF per 1 bit of capacitor.

In the case mentioned above, the equivalent thickness of the capacitor after the crystallization treatment was 3.3 nm (effective equivalent thickness of capacitor is 1.65 nm since the effective electrode surface area can be doubled by the semi-spherical silicon crystal). Then, the application limit of the capacitor has been studied. For preventing soft errors and preventing reading errors, the capacitance of a capacitor to be stored in the capacitor per 1 bit should be at least 25 fF or more. FIG. 9 shows a relation between the feature size of capacitors and the aspect ratio of a storage node for attaining 25 fF of capacitor capacitance per 1 bit (ratio between the storage node height and the feature size). It was compared for the equivalent thickness of the capacitor of 1.5 nm, 2.0 nm, 2.5 nm and 3.0 nm, and conventional 3.3 nm, respectively. The fabrication limit for preparing a rugged storage node by the application of the semi-spherical silicon crystal was at an aspect ratio of 15 in view of the yield. That is, when the feature size is 0.13 μm, the height of the storage node is 2.0 μm. It can be seen from FIG. 9 that the capacitor having 3.3 nm of equivalent thickness has an application limit in DRAM having a feature size of 0.16 μm. For attaining DRAM of higher speed and enlarged capacitance, the fabrication feature should be further reduced to 0.15 μm or less. For this purpose, the equivalent thickness of capacitor has to be reduced at least to 3.0 nm or less as can be seen from FIG. 9.

The present inventors have further analyzed the capacitor in details. The temperature necessary for the crystallization of tantalum pentaoxide is at least 700° C. By the crystallization, tantalum pentaoxide crystallizes from an amorphous structure with a relative dielectric constant of 25 into a δ-phase structure the relative dielectric constant increased to 40–60. However, since crystallization and oxidation of the silicon nitride film occur concurrently, the effect of increasing the dielectric constant was offset by the lowering of the capacitance due to oxidation of the silicon nitride film. When the temperature of heat treatment for crystallization was lowered to 700° C., oxidation of the silicon nitride film could be suppressed somewhat and the equivalent thickness could be reduced to 3.1 nm, but this resulted in a problem of increasing the leakage current density. When the leakage current of the capacitor is large, since the time till the loss of once stored information is shortened, the refresh time up to writing of the information once more is shortened to hinder high speed operation. As a threshold value, the leakage current should be 1 fA or less when a voltage of 1 V is added per 1 bit.

This invention intends to provide a capacitor having a capacitance density of a capacitor with a thickness equivalent to a silicon oxide film being 3.0 nm or less and with a leakage current of 1 fA or less upon application of a positive bias of 1 V per 1 bit on a rugged polycrystal silicon electrode, required for the fine semiconductor integrated circuits as described above.

The semiconductor integrated circuit according to this invention has a capacitor comprising a lower electrode having a polycrystal silicon film and semi-spherical silicon crystals formed on the surface thereof, a first dielectric film of 2.5 nm or more of physical thickness in contact with the lower electrode and a second dielectric film made of tantalum pentaoxide. The first dielectric film is a film of 2.5 nm or more capable of suppressing tunneling of electron from the inside of the polycrystal silicon film into tantalum pentaoxide. The film can include, for example, $Al_2O_3$, a mixed phase of $Al_2O_3$ and $SiO_2$, $ZrSiO_4$, $HfSiO_4$, a mixed phase of $Y_2O_3$ and $SiO_2$, a mixed phase of $La_2O_3$ and $SiO_2$ and a silicon nitride film.

The effect of capacitors formed by applying the interface films as a feature of this invention is to be explained with reference to FIG. 1.

Figure 1A:
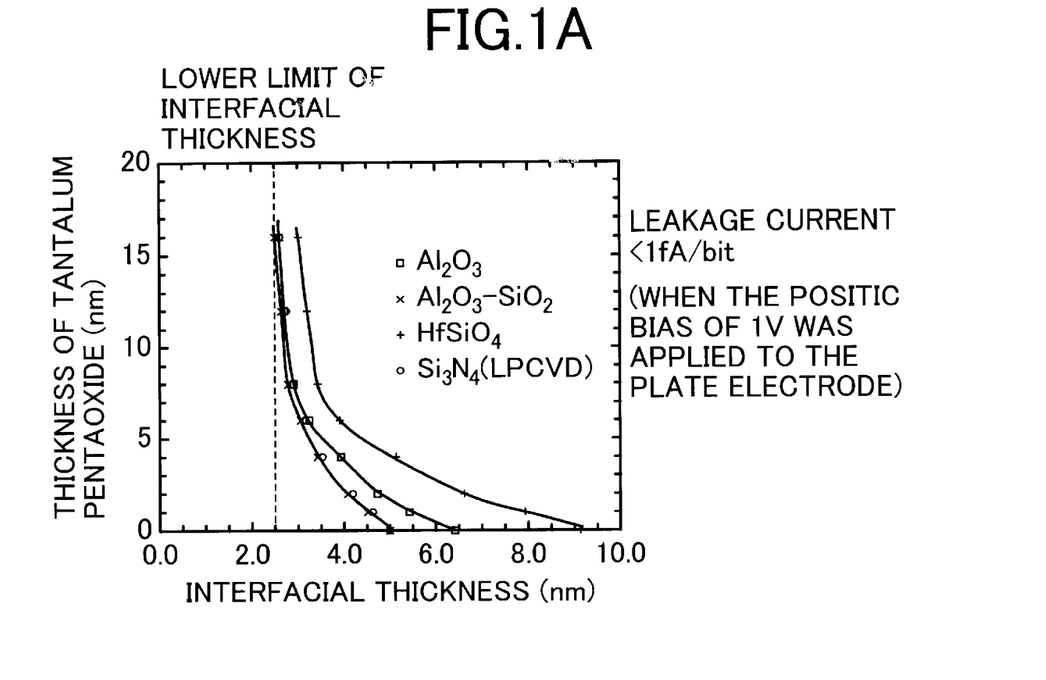
FIGS. 1A and 1B are graphs showing a relation between a interfacial thickness and a tantalum pentaoxide film thickness required for suppressing a leakage current to 1 fA/bit or less and a relation between the interfacial thickness and an equivalent thickness of capacitor for capacitors prepared in Example 1 according to this invention.

FIG. 1A shows a relation of film thickness for the thickness of the interface film and the thickness of the tantalum pentaoxide after completion of capacitors where the leakage current of capacitors is 1 fA or less when the positive bias of 1 V is applied to the plate electrode. All of the capacitors are applied with thermal treatment for crystallization in oxygen at 750° C. for 5 min. It can be seen from FIG. 1A that the thickness of tantalum pentaoxide required to suppress the leakage current to 1 fA or less (when the positive bias of 1 V is applied to the plate electrode) increases abruptly as the interface thickness is decreased. Further, it can also be seen that the trend does not depend on the interfacial film. For making the equivalent thickness of capacitor thin, it is simply considered that reduction of the thickness of the interfacial film of low dielectric constant is important. However, the result of FIG. 1(a) shows that a substantial lower limit exists for the interfacial film thickness in order to suppress the leakage current.

Figure 1B:
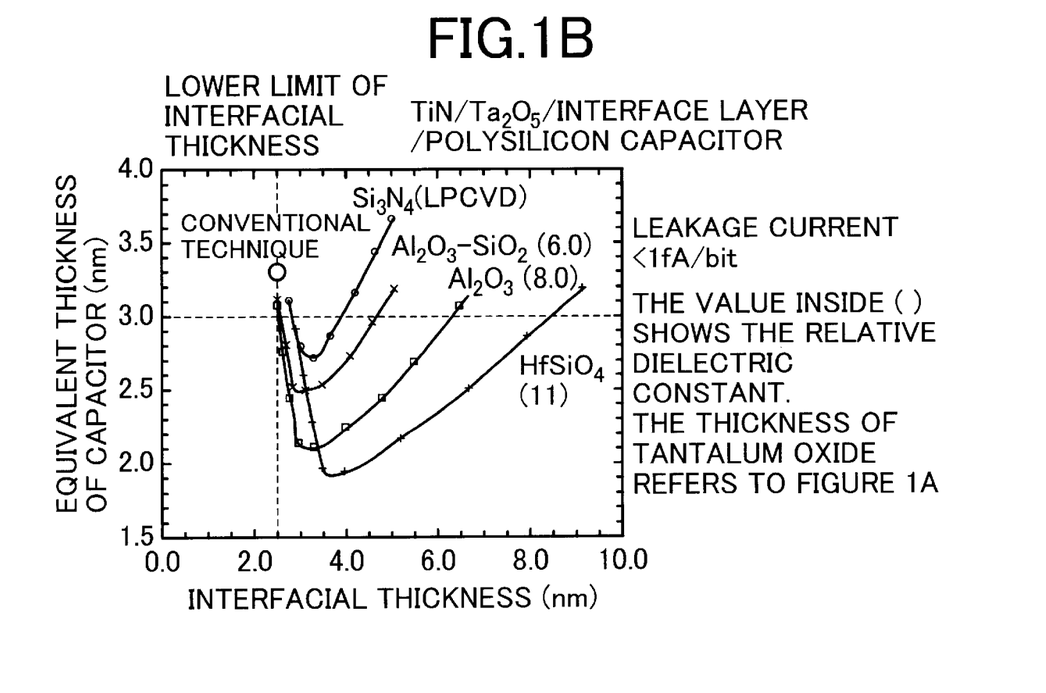

FIG. 1B shows a relation between the equivalent thickness and the interfacial thickness of capacitors having the thickness for the interfacial film and the tantalum pentaoxide shown in FIG. 1A. The abscissa indicates the thickness of the interfacial film after completion of the capacitor. The ordinate indicates a result of measurement for the equivalent thickness of capacitor having the thickness of the tantalum pentaoxide given by FIG. 1A. It can be seen that along with increase in the interfacial thickness, the equivalent thickness once shows a minimum value and then turns to increase. The equivalent film thickness of all capacitors is lowered with all the increase of the interfacial thickness, because the thickness of the tantalum pentaoxide necessary for the suppression of the leakage current is decreased remarkably. From, FIG. 1, it can be seen that the interfacial thickness should be at least 2.5 nm or more in order to suppress the leakage current and restrict the equivalent thickness to 3.0 nm or less.

Further, as shown in FIG. 1B, the equivalent thickness shows a minimum value at a certain interfacial thickness. The value for the minimum equivalent thickness is different depending on the interfacial film. Particularly, the equivalent thickness of capacitors can be reduced to about 2.0 nm by using $Al_2O_3$, $ZrSiO_4$ or $HfSiO_4$. The value is smaller by 1.0 nm or more compared with 3.3 nm that can be realized by the conventional technique. For the method of forming the interfacial film, it is preferred to adopt an atom layer deposition (ALD) method having a feature capable of precisely controlling the deposition thickness and forming a conformal film. Further, it has been found that the equivalent thickness of capacitor can be made thin as low as 2.7 nm also by previously forming the silicon nitride film of 2.5 nm or more, for example, by an LPCVD method.

Figure 8:
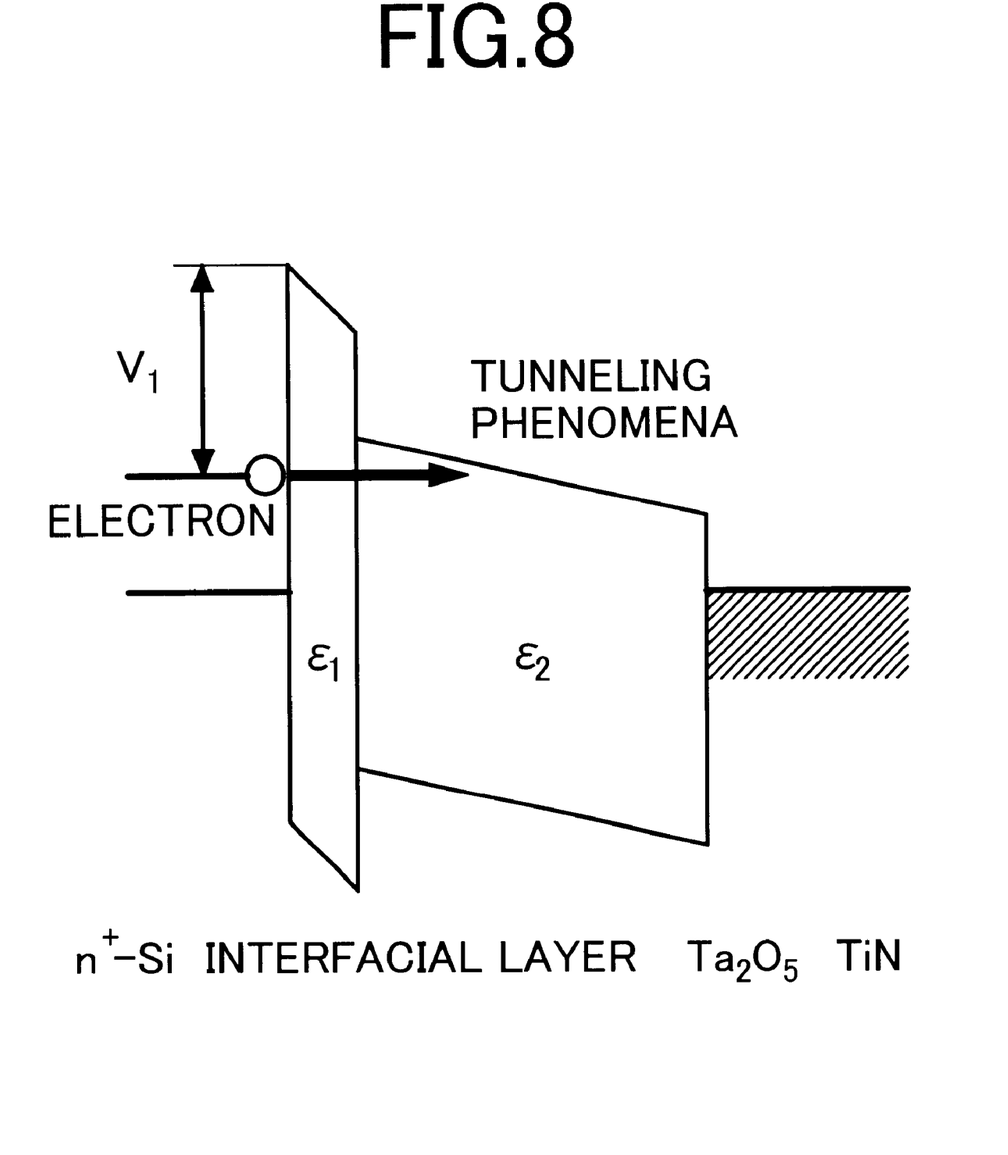
FIG. 8 is a view for explaining a leakage current mechanism of a tantalum pentaoxide capacitor.

Characteristics of the tantalum pentaoxide capacitor described above can be explained by the following mechanism based on the state of band shown in FIG. 8. The leakage current in the tantalum pentaoxide capacitor now studied in which the total thickness of the insulative films is less than 20 nm depends on the probability at which electrons are injected from a polycrystal silicon electrode into tantalum pentaoxide. Further, as shown in FIG. 1A, the film thickness of tantalum pentaoxide required for suppressing the leakage current increases remarkably at the interfacial thickness of 2.5 nm as a boundary. It can be seen from the foregoings that the tunneling current in the tantalum pentaoxide capacitor is determined by the interfacial film. The tunneling probability of the interfacial film is determined by the barrier height $V_1$ and the tunneling distance t of the interfacial film relative to electrons in the polycrystal silicon electrode. A film of higher dielectric constant generally has a lower barrier height and the tunneling probability is high when compared with respect to the identical film thickness. A film having a higher barrier height than the barrier height of tantalum pentaoxide to silicon (1.5 eV) is a candidate for the interfacial film. Further, it is desirable for a interfacial film with a lower formation energy of oxide than that of the silicon oxide film for suppressing the oxidation of the lower silicon electrode. The barrier height of any of such interfacial films is lower compared with 3.1 eV of the silicon oxide film. The formula for the direct tunneling current of the interfacial film is shown, for example, in S. M. Sze: Physics of Semiconductor devices (Wiley, N.Y., 1981), p. 553–557.

The tunneling probability when a positive bias voltage $+V_a$ (V) is applied to the plate electrode decreases exponentially relative to the tunneling distance, and it decreases exponentially relative to $(V_1-V_a/2)^{0.5}$ with respect to the barrier height. This shows that the dependency on the barrier height is smaller than that on the film thickness. Accordingly, it is considered that a lower limit for the interfacial thickness exists in order to obtain a capacitor of low leakage current. In addition, since the tantalum pentaoxide film can be made remarkably thin by a slight increase in the thickness of the interfacial film as shown in FIG. 1B, this can lead to a result that the equivalent thickness can be made thin as the thickness of the interfacial film is large with a certain range regarding the equivalent thickness of the entire capacitor. Accordingly, it is considered that a substantial lower limit exists for the interfacial thickness also in order to obtain a tantalum pentaoxide capacitor of reduced equivalent thickness. The thickness of the capacitor can be made thin compared with the conventional technique, because a film having a higher relative dielectric constant of the interfacial film compared with that of the nitride film (actually, oxynitride film approximate to oxide film) can be selected. Since the interfacial layers have lower value compared with the silicon oxide film, it is necessary to make the film thick in order to decrease the leakage current. However, since the relative dielectric constant is high, it is advantageous to apply such interfacial films. On the other hand, the equivalent film thickness turns to increase at a certain interfacial thickness as a boundary, because it is considered that a large electric field is concentrated to the interfacial film and it transfers from the direct tunneling current characteristics to a large leakage current in an FN tunneling manner.

On the other hand, the leakage current, when a negative voltage is applied to the plate electrode, is mainly determined depending on the height of the Schottky barrier formed between the tantalum pentaoxide and the titanium nitride upper electrode. As the capacitance of the interfacial film is larger, electric field exerting on tantalum pentaoxide increases, so that the leakage current increases. However, so long as the interfacial film described above is concerned, the leakage current is sufficiently low and causes no problems. In a case where the leakage current is intended to be lowered further, a metal such as ruthenium having a larger work function than the titanium nitride may also be used as the upper electrode.

DETAILED DESCRIPTION OF THE PREFERRED EMBODIMENT

EXAMPLE 1

This example discloses a method of fabricating a memory capacitor of DRAM having capacitors according to this invention (FIG. 4).

Figure 4A:
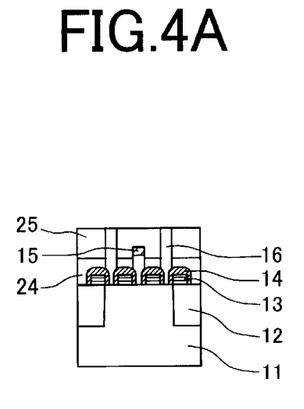
FIGS. 4A–4G are cross sectional structural views showing a method of fabricating a memory cell portion of DRAM prepared in Example 1 according to this invention.

A bit line 15 is formed on a memory cell selection transistor formed by a known method and polycrystal silicon plugs 16 for electrical connection between the selection transistor and the capacitor is formed (FIG. 4A).

Figure 4B:
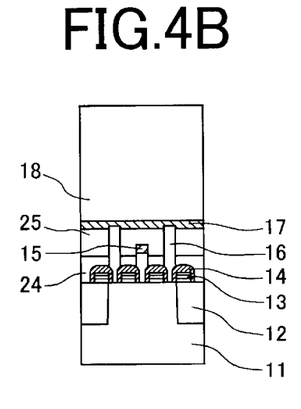

A silicon nitride film 17 of about 100 nm thickness is deposited by a CVD method above the silicon plugs as an etching stopper for fabricating a silicon oxide film. A silicon oxide film 18 is formed by 2 □m above the silicon nitride film 17 using tetraethoxysilane (TEOS) as a starting material (FIG. 4B).

Figure 4C:
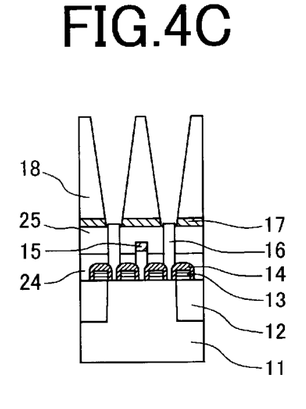

The silicon oxide film 18 and the silicon nitride film 17 were fabricated by a dry etching method using a photoresist as a mask to form grooves for a lower electrode above the polycrystal silicon plugs 16 (FIG. 4C).

Figure 4D:
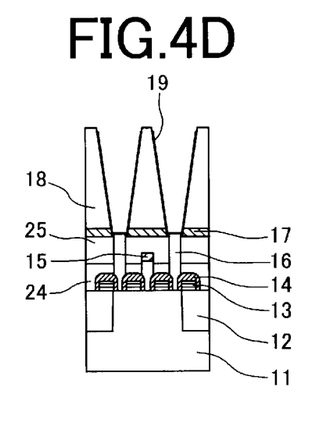
Figure 4E:
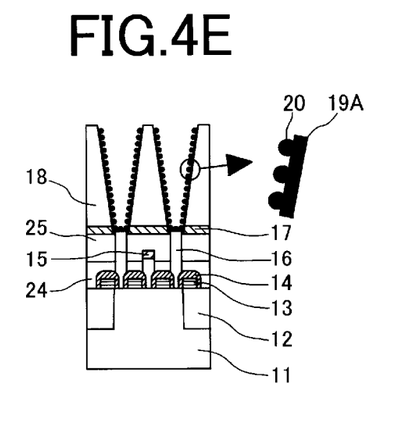

Further, phosphorus-doped amorphous silicon film 19 was deposited by 35 nm and the amorphous silicon film 19 was separated on every bit by a known etching back technique using the photoresist film (FIG. 4D).

After a cleaning step, a nuclear forming treatment is applied to the surface of the amorphous silicon film 19 to form semi-spherical silicon crystal 20 (crystallization). Then, phosphorus was doped by using, for example, phosphine to the surface formed of the semi-spherical silicon crystal 20 for compensating the lowered phosphorus concentration, to complete a lower electrode structure (FIG. 4E)).

Figure 4F:
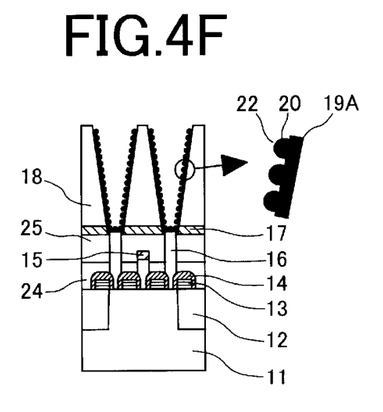
Figure 4G:
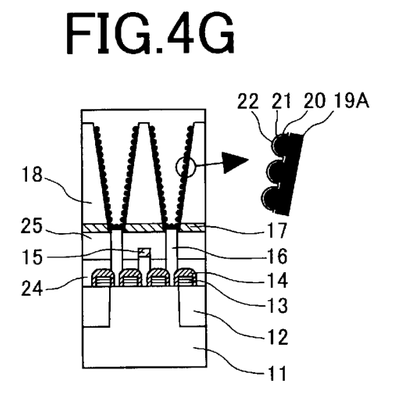

Further, an interfacial film 21 is formed on the surface of the lower electrode (FIG. 4F). The interfacial film 21 has a thickness capable of suppressing tunneling of electrons into tantalum pentaoxide from $Al_2O_3$, a mixed phase of $Al_2O_3$ and $SiO_2$, $ZrSiO_4$, $HfSiO_4$, a mixed phase of $Y_2O_3$ and $SiO_2$, a mixed phase of $La_2O_3$ and $SiO_2$, and a polycrystal silicon film such as silicon nitride film. The deposited film thickness has to be adjusted upon deposition such that the thickness is 2.5 nm or more after the completion of the capacitor as shown in FIG. 1.

Figure 3:
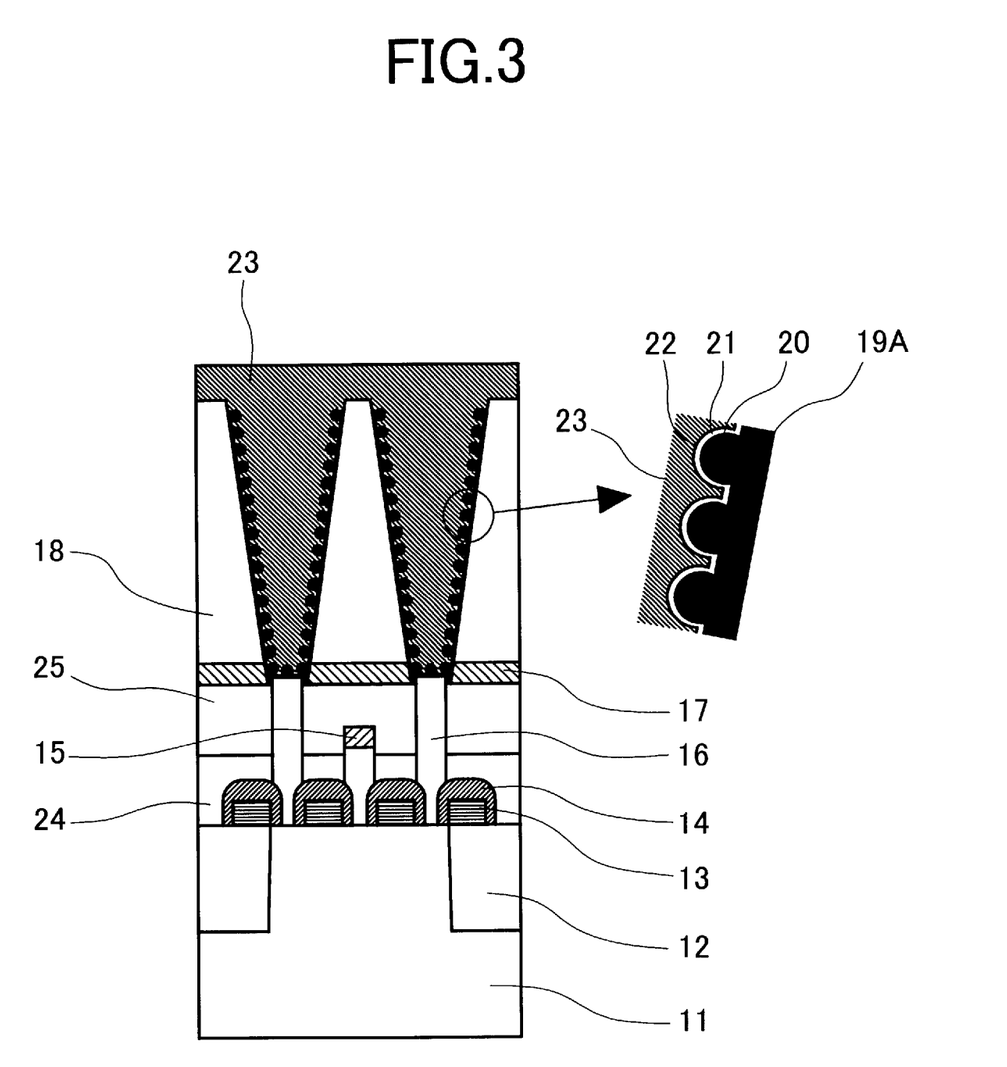
FIG. 3 is a cross sectional structural view for a memory cell portion of DRAM prepared in Example 1 according to this invention.

Further, tantalum pentaoxide 22 of the optimum film thickness shown in FIG. 1A is deposited depending on the interfacial thickness and applied with a thermal treatment in an oxygen atmosphere at 700° C. or higher to crystallize the same (FIG. 4F). Finally, an upper electrode 23 is formed to complete a capacitor (FIG. 3).

EXAMPLE 2

This example discloses a fabrication method of applying $Al_2O_3$ (alumina) as an interfacial film 21 and an optimizing method thereof. Alumina is formed by an atom layer deposition method above the rugged lower electrodes 19, 20 of polycrystal silicon. Trimethylaluminum [$Al(CH_3)_3$] was used as an organoaluminum compound. Further, $H_2O$ was used as an oxidizing gas. The substrate temperature was set to 350° C. The reaction scheme is as given by the following equations.

$$Si\text{—}OH+Al(CH_3)_3 \rightarrow Si\text{—}O\text{—}Al(CH_3)_2+CH_4\uparrow \quad (1)$$

$$Si\text{—}O\text{—}Al(CH_3)_2+2H_2O \rightarrow Si\text{—}O\text{—}Al(OH)_2+2CH_4\uparrow \quad (2)$$

At first, the surface of polycrystal silicon is terminated with hydroxyl groups (OH) by HF cleaning. Then, a precursor of trimethyl aluminum ($Al(CH_3)_3$) is introduced on an argon carrier gas into a reaction chamber and adsorbed at saturation on the surface of polycrystal silicon. In this process, one of the methyl groups is bonded with hydrogen of the OH group to form $CH_4$, which is evaporated to form a state of Si—O—$Al(CH_3)_2$ (formula (1)). The pressure in the film deposition chamber is 5 Torr. The time necessary for saturation adsorption is at most 1 s. After evacuation, the atmosphere is switched to $H_2O$. As shown in the formula (2), Si—O—$Al(OH)_2$ is formed by surface oxidizing reaction. The pressure in the film deposition chamber is set to 5 Torr. The oxidizing reaction is terminated at the instance all the methyl groups are replaced with hydroxyl groups. The time required for the reaction is at most 2 s. After the steps described above as 1 cycle, when $Al(CH_3)_3$ is introduced again, the reaction of the formula (1) proceeds to continuously deposit the $Al_2O_3$ film. Accordingly, the thickness of the deposition film can be controlled precisely by the number of cycles. Further, since this is limited by surface reaction, it has a feature capable of forming a conformal film. By applying the procedures by 50 cycles, an $Al_2O_3$ film 21 of 2.7 nm thickness was formed.

Further, an amorphous tantalum pentaoxide film 22 was formed by a CVD method. For example, an amorphous tantalum pentaoxide film of 8 nm was formed using pentoethoxy tantalum as a starting material at a substrate temperature of 450° C. Successively, it was crystallized into δ-phase tantalum pentaoxide by applying a thermal treatment in oxygen at 750° C. for 5 min. The upper electrode 23 was formed by depositing a titanium nitride film by a CVD method. The film thickness is selected so as to embed grooves constituted with the lower electrodes 19 and 20 and the dielectric films 21 and 22, and the surface unevenness attributable to the lower electrode grooves is planarized to obtain a structure of FIG. 3.

As the CVD method, a reduced pressure CVD method using, for example, titanium tetrachloride and ammonia as starting material is appropriate. Further, the film thickness was increased optionally by a sputtering method to lower the resistance of the upper electrode 23. Further, for removing chlorine remaining in titanium chloride formed by the CVD method, a treatment at about 500° C. can also be applied as a thermal treatment after forming the electrode. The upper electrode 23 is fabricated by dry etching using a photoresist as a mask to remove titanium nitride from a portion other than the memory cell portions. Further, by way of known interconnection steps, a semiconductor integrated circuit is completed.

Figure 5A:
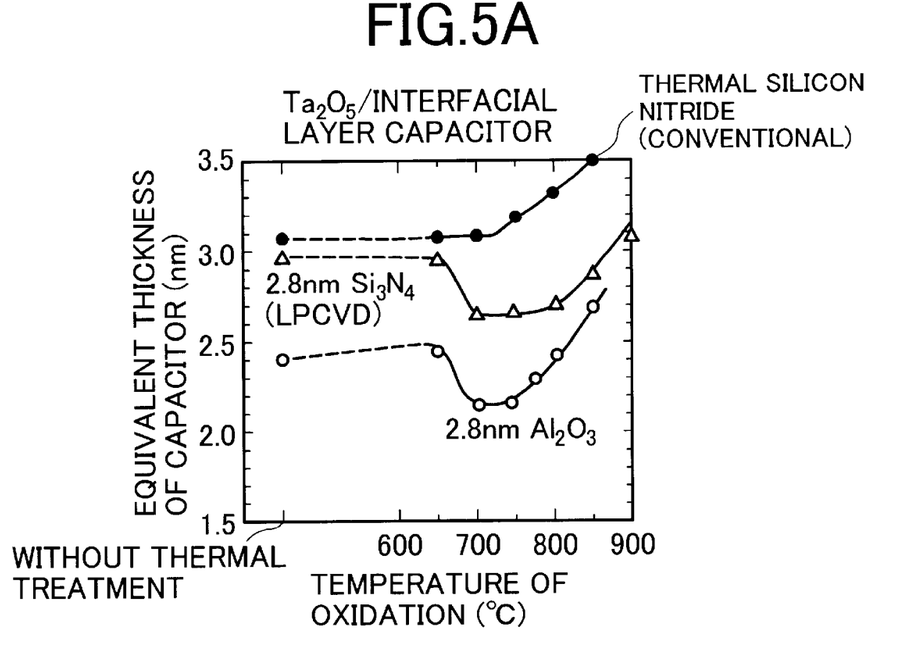
FIGS. 5A and 5B are views showing a relation between the thermal treatment temperature in an oxygen atmosphere, and an equivalent thickness of capacitors and leakage current (when positive bias of +1 V is applied to the plate electrode), for silicon nitride film formed by a thermal nitridation method and an LPCVD method and an $Al_2O_3$ film formed by an atom layer deposition method.

FIG. 5A shows a relation between a thermal treatment temperature for crystallization of tantalum pentaoxide films and equivalent thickness of capacitor. The deposition thickness of the $Al_2O_3$ is 2.7 nm and the thickness of the tantalum pentaoxide film is 8 nm. Further, the result of forming a silicon nitride film of 1.5 nm by thermal nitridation method in ammonia as the conventional technique is also shown. In a case of applying the $Al_2O_3$ film, while the equivalent thickness of capacitor not applied with the thermal treatment was 2.4 nm, it is made into a thin film of 2.1 nm at a temperature of 700° C. This is because the tantalum pentaoxide film is crystallized and transferred to the δ-phase to increase the relative dielectric constant to a higher value of 60. However, when the thermal treatment temperature exceeds 775° C., the equivalent thickness increases. It is considered that this may be attributable to the progress of formation of the silicon oxide film $SiO_2$ at the interface between $Al_2O_3$ and the polycrystal silicon. For example, $SiO_2$ of about 0.5 nm is formed at a thermal treatment temperature of 800° C. Further, it was also confirmed that an $SiO_2$ film of 0.2 nm film was formed by a thermal treatment at 750° C. On the other hand, in the case of using the conventional technique, reduction of the equivalent thickness along with crystallization of the tantalum pentaoxide film is not observed. This is because the effect of increasing the dielectric constant is offset by the lowering of the capacitance by the oxidation of the silicon nitride film since crystallization and oxidation of silicon nitride film occur simultaneously. The equivalent thickness of capacitor is 3.3 nm at a thermal treatment temperature of 800d° C.

Figure 5B:
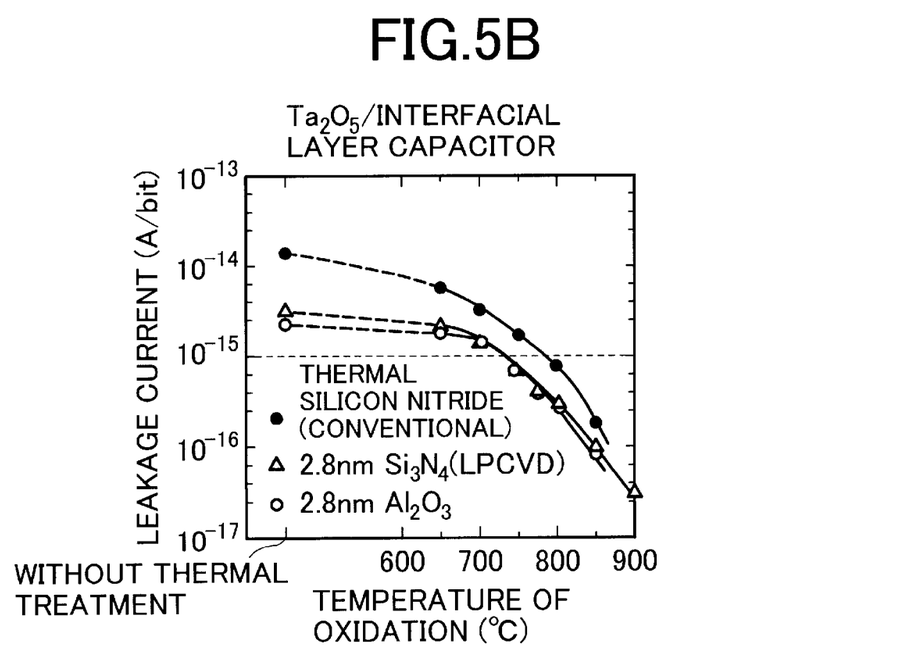
Figure 7:
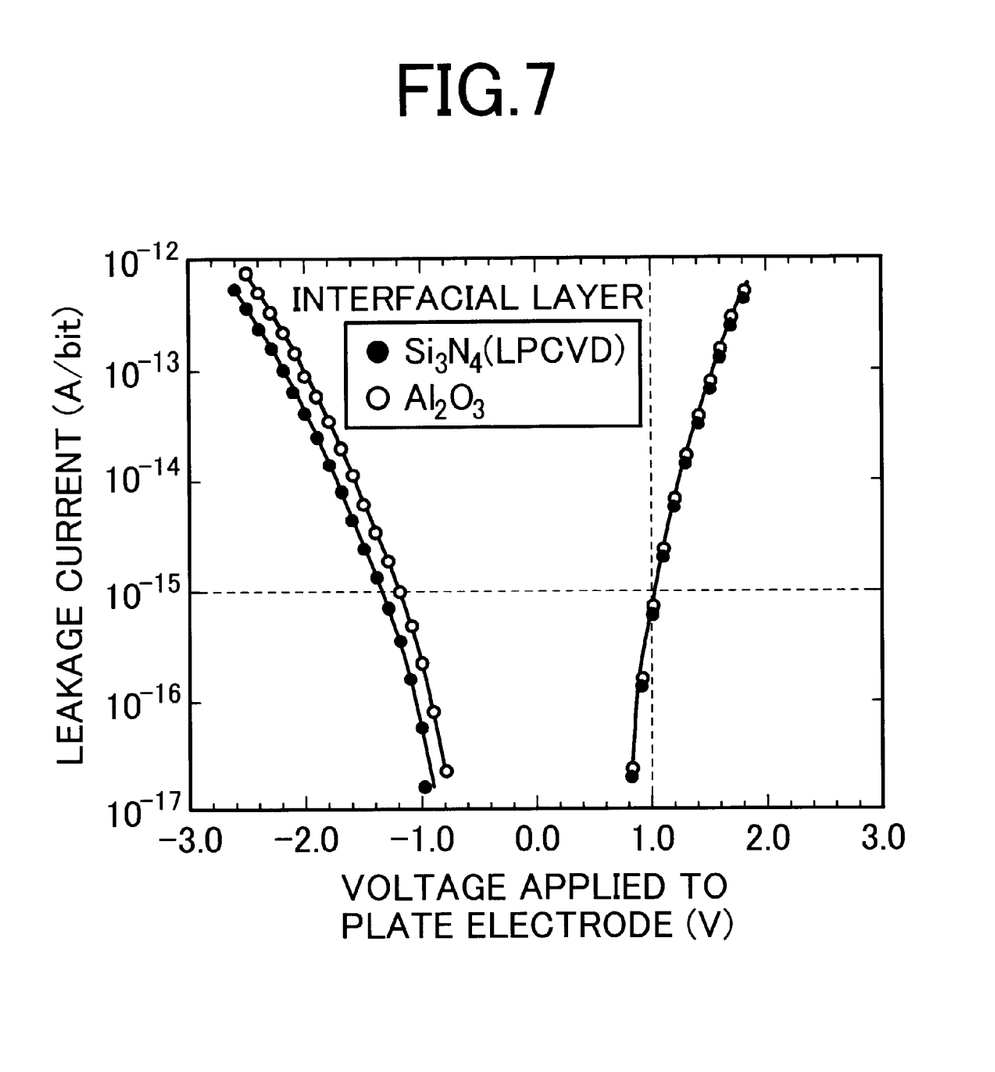
FIG. 7 is a graph showing a voltage dependence of a leakage current for a silicon nitride film formed by an LPCVD method and an $Al_2O_3$ film formed by an atom layer deposition method.

FIG. 5B shows a relation between a thermal treatment temperature and a leakage current when a positive bias of 1 V is supplied to a plate electrode. In the case of the conventional capacitor, the leakage current can be suppressed to 1 fA or less by the thermal treatment at 800° C. or higher at which formation of $SiO_2$ proceeds. When the $Al_2O_3$ is used, the leakage current can be suppressed to 1 fA or less at 750° C. or higher. The equivalent thickness of capacitor after the thermal treatment at 750° C. was 2.1 nm. FIG. 7 shows a relation between the applied voltage and the leakage current. The leakage current when the positive bias of 1 V was applied is sufficiently small as 0.7 fA. Further, when an $Al_2O_3$ of 3.1 nm was formed, with the number of cycles for 60 in the atom layer deposition method, the equivalent film thickness of capacitor could be reduced to 2.1 nm by forming the tantalum pentaoxide film of 6 nm.

Figure 2A:
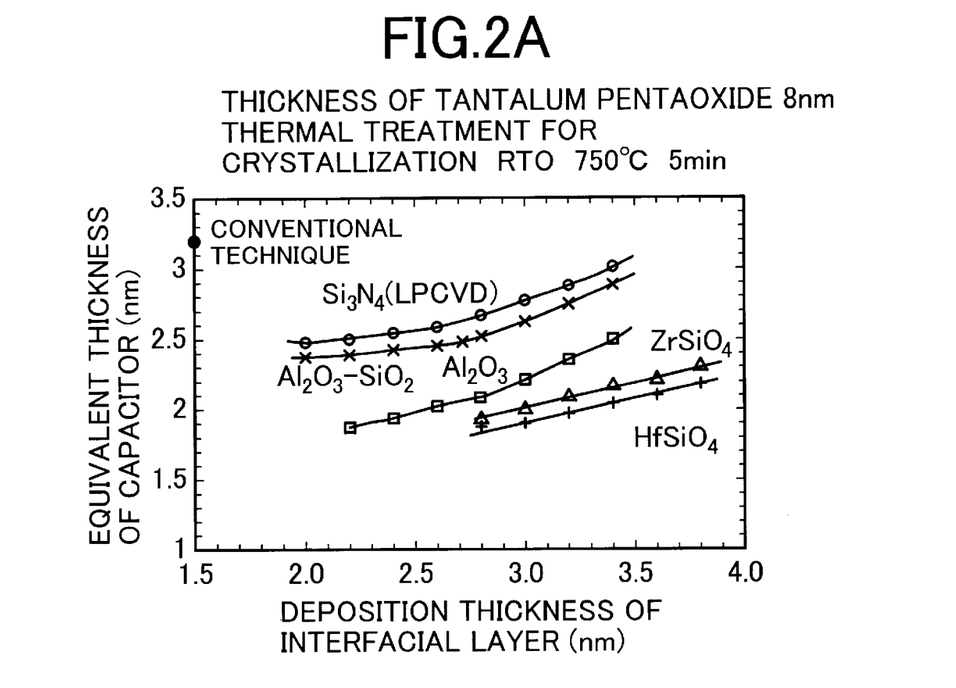
FIGS. 2A and 2B are views showing a relation between the deposited thickness of each interfacial film, and an equivalent thickness of capacitor after thermal treatment in an oxygen atmosphere at 750° C. and a leakage current (when positive bias voltage of +1 V is applied to the plate electrode) in a case where the tantalum pentaoxide film thickness is 8 nm.
Figure 2B:
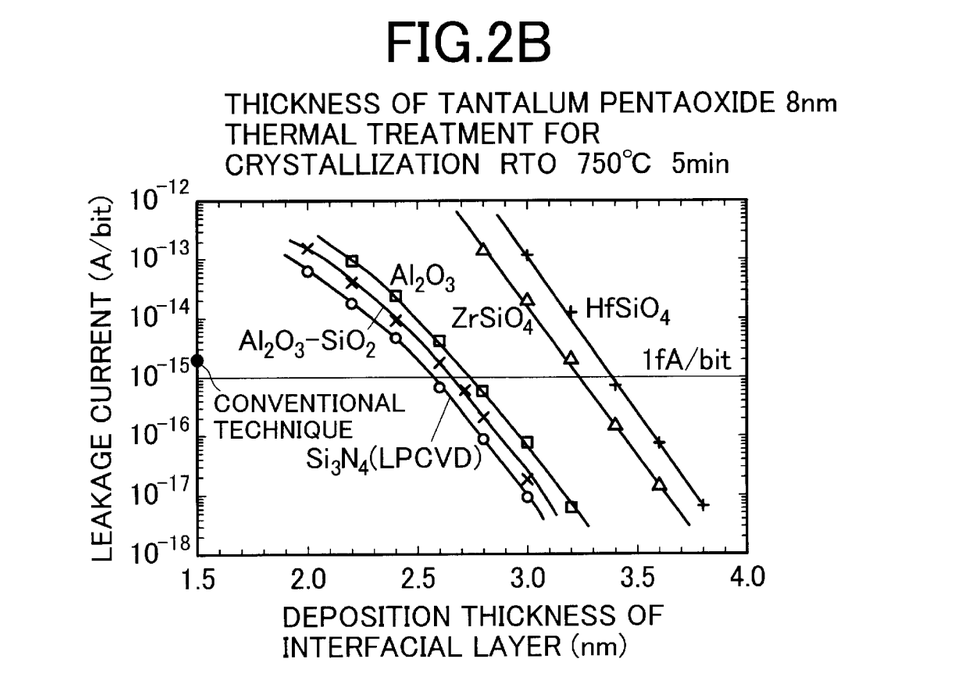

On the other hand, FIG. 2A shows a relation between the deposition thickness of $Al_2O_3$ and the equivalent thickness of capacitor after the thermal treatment in oxygen atmosphere at 750° C. Further, FIG. 2B shows a relation between the deposition thickness of $Al_2O_3$ films and the leak current (when the positive bias voltage of 1 V is applied to a plate electrode) after the thermal treatment in oxygen atmosphere at 750° C. However, the film thickness of the tantalum pentaoxide was set to 8 nm. It can be seen from FIG. 2B that the leakage current decreases as the thickness of the $Al_2O_3$ film increases. In order to suppress the current to 1 fA or less, it is necessary that the $Al_2O_3$ has to be deposited previously by 2.8 nm or more. In this case, the interfacial thickness after the oxidizing treatment increased by 0.2 nm into 3.0 nm. This is because the silicon oxide film $SiO_2$ is formed at the interface between $Al_2O_3$ and polycrystal silicon.

The same result could be obtained also by using $Al(CH_3)_2Cl$ instead of $Al(CH_3)_3$ as the starting material for the atom layer deposition method. The same effect was obtained also by using $H_2O_2$ or $N_2O$ as the oxidizing gas. For the method of forming the $Al_2O_3$, it can be formed also by a known CVD method instead of the atom layer deposition method. The same result as in the atom layer deposition method was obtained for the optimum distribution of the film thickness.

EXAMPLE 3

This example discloses a fabrication method of using an interfacial film 21 comprising a mixed phase of $Al_2O_3$ and $SiO_2$, and an optimizing method thereof. A mixed phase is formed by an atom layer deposition method above rugged polycrystal silicon 19, 20. $Al(CH_3)_3$ and $Si_2H_6$ and $H_2O$ were used as the starting material. The substrate temperature was set to 300° C. In the same manner as in Example 2, since the controllability for the film thickness is high because of a layer by layer growth method and, since the film growth is limited by surface reaction, an interfacial film 21 comprising a conformal mixed phase of $Al_2O_3$ and $SiO_2$ can be formed. When the bonding state of the film was examined by using X-ray photoelectron spectroscopy, only the bond between $Al_2O_3$ and $SiO_2$ was observed to confirm that this is a mixed phase. The mixing ratio was about 1:1. The relation between the tantalum pentaoxide film thickness and the interfacial film thickness necessary for suppressing the leakage current to 1 fA or less is as shown in FIG. 1A. After forming the amorphous tantalum pentaoxide film, heat treatment for crystallization is applied at 750° C. and, further, the method shown in Example 2 is applied to complete a semiconductor integrated circuit. A capacitor having an equivalent thickness of 2.5 nm could be formed by a capacitor comprising an interfacial film 21 of 2.9 nm comprising a mixed phase of $Al_2O_3$ and $SiO_2$, and a of tantalum pentaoxide film of 8 nm. In a case of using tantalum pentaoxide film of 6 nm, an interfacial film 21 of 3.1 nm was necessary. Also in this case, a capacitor having an equivalent thickness of 2.5 nm could be formed.

FIG. 2A shows a relation between the deposition thickness of the mixed film of $Al_2O_3$ and $SiO_2$ and the equivalent thickness of capacitor after the thermal treatment in an oxygen atmosphere at 750° C. Further, FIG. 2B shows a relation between the deposition thickness and the leakage current (when positive bias of 1 V is applied to the plate electrode) after the thermal treatment in an oxygen atmosphere at 750° C. The thickness of the tantalum pentaoxide film was 8 nm. It can be seen from FIG. 2B that the mixed film of $Al_2O_3$ and $SiO_2$ has to be deposited previously by 2.7 nm or more in order to suppress the leakage current to 1 fA or less. In this case, the interfacial thickness after the oxidizing treatment was increased by 0.2 nm into 2.9 nm by formation of $SiO_2$.

The same effect could be obtained also by using $Al(CH_3)_2Cl$ instead of $Al(CH_3)_3$ as the starting material for the atom layer deposition method. Further, $SiH_4$ may be used instead of $Si_2H_6$ and the same effect was obtained also by using $H_2O_2$ and $N_2O$ as the oxidizing gas.

EXAMPLE 4

This example discloses a fabrication method of using an interfacial film 21 comprising $HfSiO_4$ and an optimizing method thereof. $HfSiO_4$ is formed by an atom layer deposition method above lower electrodes 19, 20 of rugged polycrystal silicon. $HfCl_4$, $Si_2F_6$ and $H_2O$ were used as the starting material. The substrate temperature was set to 300° C. In the same manner as in Example 2, the controllability for the film thickness is high because of layer by layer growth method and a conformal $HfSiO_4$ could be formed since the film growth being restricted at the surface reaction. The relation between the tantalum pentaoxide film thickness and the $HfSiO_4$ film thickness necessary for suppressing the leakage current to 1 fA or less is as shown in FIG. 1A. In $HfSiO_4$ with lowest barrier, the interfacial thickness required for suppressing the leakage current is larger compared with other films of higher barrier. However, as shown in FIG. 1B, since the relative dielectric constant is as high as 11, when it was formed to 3.4 nm thickness by the atom layer deposition method and the tantalum pentaoxide film of 8 nm was applied, the equivalent thickness of capacitor could be reduced as thin as 1.9 nm.

As the starting material, any halogenation material such as $HfF_4$ is applicable in addition to $HfCl_4$. Further, the same effect was also obtained by using $Si_2H_6$ instead of $SiH_4$ and using $H_2O_2$ or $NO_2$ as the oxidizing gas. Further, halogenozirconium compound such as $ZrCl_4$ may be used as the starting material and $ZrSiO_4$ may be used for the interfacial film 21. In this case, the relative dielectric constant of $ZrSiO_4$ is 9.5 and when the film thickness was 3.3 nm, the equivalent thickness of capacitor could be reduced as far as 2.0 nm.

FIG. 2A shows a relation between the deposition thickness of the $HfSiO_4$ film and $ZrSiO_4$ film and the equivalent thickness of capacitor after oxidizing thermal treatment in an oxygen atmosphere at 750° C. Furthermore, FIG. 2B shows the relation between the deposition thickness of $HfSiO_4$ film and $ZrSiO_4$ film and a leakage current (when positive bias of 1 V is applied to the plate electrode) after oxidizing thermal treatment in an oxygen atmosphere at 750° C. However, the film thickness of tantalum pentaoxide was set to 8 nm. It can be seen from FIG. 2B that the $HfSiO_4$ film and the $ZrSiO_4$ film have to be deposited previously by 3.4 nm and 3.3 nm or, more respectively, in order to suppress the leakage current to 1 fA or less.

Further, the $HfSiO_4$ film and the $ZrSiO_4$ film are applicable not only at the stoichiometrical composition but also as a mixed phase of $HfO_2$ —$SiO_2$ or a mixed phase of $ZrO_2$—$SiO_2$. In a case where the $SiO_2$ ratio is larger, the optimum interfacial thickness is somewhat reduced. However, since the effect of decreasing the relative dielectric constant is more significant, the equivalent thickness increases. In a case where the $SiO_2$ ratio is smaller, while the relative dielectric constant increases the optimum interfacial thickness also increases and since the latter effect is more significant, the equivalent thickness increases.

Further, the mixed phase of $Y_2O_3$ and $SiO_2$ and the mixed phase of $La_2O_3$ and $SiO_2$ may be applied as the interfacial film 21. The optimum interfacial thickness thereof and the equivalent thickness of capacitor were comparable with the $HfSiO_4$ film and $ZrSiO_4$ film.

EXAMPLE 5

Figure 6:
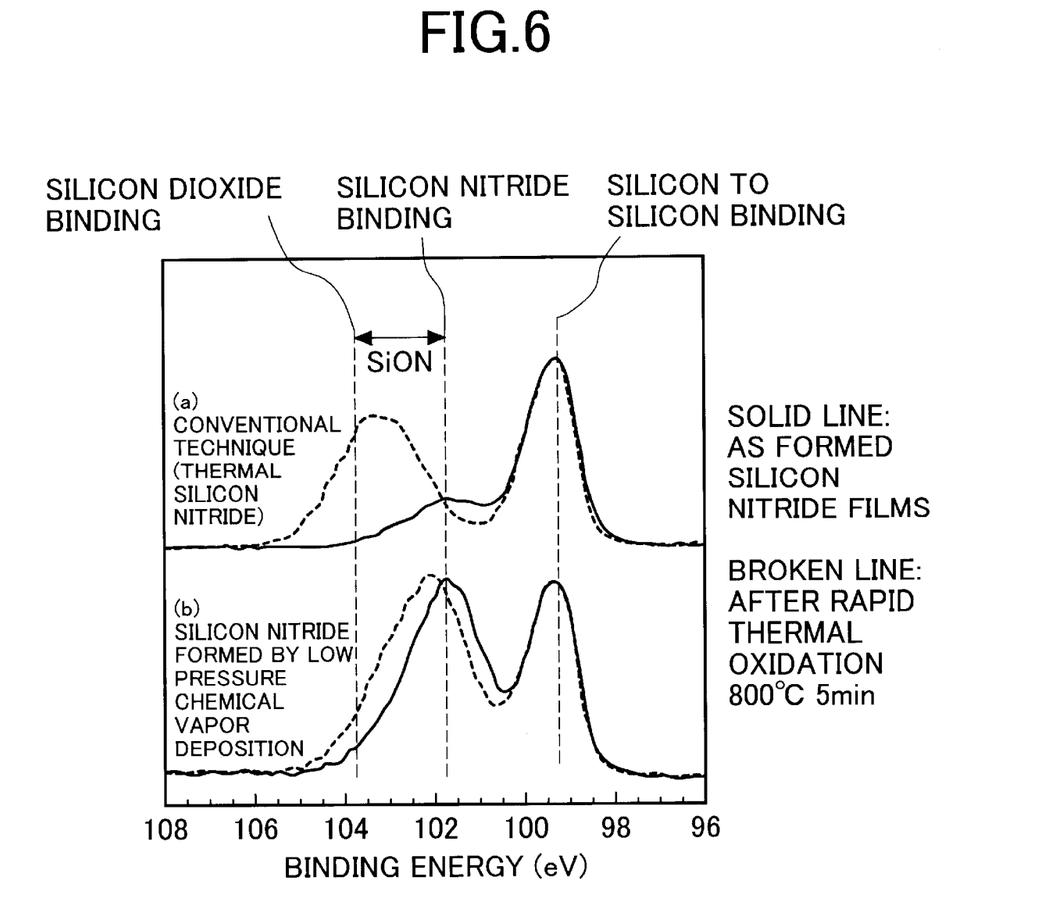
FIG. 6 is a graph comparing X-ray photoelectron spectra of Si2p electrons just after nitridation and after oxidizing thermal treatment at 800° C. for 5 min, in an oxygen atmosphere for silicon nitride films formed by a thermal nitridation method and an LPCVD method.

This example discloses a fabrication method of using an interfacial film 21 comprising a silicon nitride film formed by an LPCVD method and an optimizing method thereof. In the conventional technique, the film was formed by a thermal nitridation method at a substrate temperature of 800° C. in an ammonia atmosphere but the silicon nitride film was oxidized during thermal treatment for crystallization of tantalum pentaoxide (800° C. in oxygen) to lower the capacitance of capacitor. It is important to form an interfacial film of high oxidation resistance and low leakage current. Then, a planar polycrystal silicon film was prepared, a conventional silicon nitride film and a silicon nitride film by the LPCVD method were formed and the bonding state was compared using an X-ray photoelectron spectroscopy. Since X-rays entered vertical to the substrate, it shows the state within a range of about 2 nm from the surface. The solid line in FIG. 6A shows spectrum of Si2p electrons just after nitridation for the thermal nitridation film formed by the conventional technique. A peak appearing at 99.2 eV shows the bonding state between Si to each other in the polycrystal silicon substrate. On the other hand, a peak appearing near 101.7 eV on the higher energy side shows bonding peak for Si and N, that is, the bonding state of an $Si_3N_4$ film. Since the bonding peak of the $Si_3N_4$ film is smaller than the bonding peak in the Si substrate, it can be seen that the $Si_3N_4$ film is thin. Further, since the half-width value of the bonding peak in the $Si_3N_4$ film is large this shows the presence of Si not bonded with N and Si bonded with O. Actually, it was observed from the XPS spectrum of oxygen that the bonding peak of O1s electron is large. The result of conventional rapid thermal treatment conducted for the silicon nitride film in oxygen at 800° C. for 5 min is also shown by the broken line in FIG. 6A. The bonding peak in the $Si_3N_4$ film observed near 101.7 eV disappeared and a large peak appeared near 103.2 eV. This is because the silicon nitride film was oxidized to form an oxynitride film. As the oxidation of the nitride film proceeds, the peak shifts to the higher energy side. Since the bonding energy in the $SiO_2$ film is 103.7 eV, it can be seen that the existent film is almost approximate to an oxide film. On the other hand, FIG. 6B also shows the result of surface analysis for the silicon nitride film formed to a thickness of 2.5 nm at 650° C. by an LPCVD method using dichlorosilane ($SiH_2Cl_2$) and ammonia ($NH_3$) as the starting material. Since the peak appearing near 101.7 eV showing the bonding state of the $Si_3N_4$ film just after nitridation is large and the half-high width value is small, it can be seen that a thick nitride film about at a stoichiometrical ratio is formed. Further, it can be seen that the shift of the peak toward the higher energy side after the oxidizing thermal treatment is small and the oxidation resistance is also high.

FIG. 2A shows a relation between the deposition thickness of silicon nitride films by an LPCVD method and an equivalent thickness of capacitor after the oxidizing thermal treatment in an oxygen atmosphere at 750° C. FIG. 2B shows a relation between the deposition thickness of silicon nitride film by the LPCVD method and a leakage current (when positive bias of 1 V is applied to the plate electrode) after the thermal treatment in an oxygen atmosphere at 750° C. However, the film thickness of tantalum pentaoxide is 8 nm. It can be seen from FIG. 2B that the leakage current decreases as the thickness of the silicon nitride film increases. For suppressing the leakage current to 1 fA or less, it is necessary to previously deposit the silicon nitride film to 2.8 nm or more. In this case, the interfacial thickness after the oxidizing treatment was increased by 0.3 nm into 3.1 nm. This is because the silicon nitride film by the LPCVD method having high oxidation resistance is also oxidized at the top surface of the nitride film. The equivalent thickness of the capacitor was 2.7 nm. On the other hand, in the conventional nitride film, the interfacial film is an oxynitride film almost equal with the oxide film and the equivalent thickness of capacitor is 3.2 nm.

On the other hand, FIG. 5A shows a relation between the thermal treatment temperature for crystallization of a tantalum pentaoxide film and an equivalent thickness of capacitor having a silicon nitride film formed by the LPCVD method as an interfacial film. The deposition thickness of the silicon nitride film is 2.8 nm and the film thickness of the tantalum pentaoxide is 8 nm. The result of forming a silicon nitride film of 1.5 nm by a thermal nitridation method in ammonia for the conventional technique is also shown. It can be seen that when the silicon nitride film formed by the LPCVD method was used, the equivalent thickness of capacitor not applied with the thermal treatment was 3.0 nm, which was 2.7 nm at a temperature of 700° C. This is because the relative dielectric constant increases to a higher dielectric constant of 60 by the transformation of the tantalum pentaoxide film to the δ-phase by crystallization. The equivalent thickness is increased by the oxidation of the silicon nitride film when a thermal treatment at 800° C. or higher was applied. This shows that the oxidation resistance is higher by about 100° C. compared with the case of using the silicon nitride film formed by the conventional thermal nitridation method shown in the figure.

FIG. 5B shows the relation between the thermal treatment temperature and the leakage current when the positive bias of 1 V is applied to the plate electrode. When a silicon nitride film formed by the LPCVD method is used, the leakage current can be suppressed to 1 fA or less at 750° C. or higher. The equivalent thickness of capacitor was 2.7 nm when a thermal treatment at 750° C. was applied. FIG. 7 shows a relation between the voltage applied and the leakage current. When the positive bias of 1 V is applied, the leakage current is sufficiently small as 0.8 fA. Further, when a silicon nitride film of 3.1 nm was formed, the equivalent thickness of the capacitor could be 2.7 nm by forming a tantalum pentaoxide film of 6 nm.

As described above, the silicon nitride film is used as the interfacial film, it is important to suppress oxidation of the nitride film, and control the same to an oxynitride film of high relative dielectric constant. For this purpose, it is necessary to previously form a thick nitride film. In a direct nitridation method such as thermal nitridation in ammonia adopted so far in the conventional technique, since the thickness of the nitride film changes in a logarithmic manner relative to the reaction time, it is difficult to form a film of 2.0 nm or more of thickness in a short period of time even when the processing temperature is 900° C. In this case, it also results in a problem of deteriorating the transistor characteristics because of high temperature thermal treatment. On the other hand, the method of forming the nitride film by a deposition method such as an LPCVD method is advantageous also in view of mass productivity since a desired film thickness can be formed at a low temperature in a short period of time.

In the formation of the silicon nitride film, when the surface of polycrystal silicon is previously nitrided thermally in an $NH_3$ atmosphere at 800° C. or lower and then an LPCVD nitride film is formed, or when plasma nitridation is applied at 700° C. or lower instead of thermal nitridation, a capacitor having an equivalent thickness of 2.7 nm could be formed in the same manner as described above by controlling the total nitride film thickness to 2.8 nm. Further, a same capacitor described above could be formed also by forming the silicon nitride film by an atom layer deposition method using $Si_2H_6$ and $NH_3$.

According to this invention, a capacitor showing a sufficient electrostatic capacitance and a low leakage current can be constituted even when it is reduced in the size, thereby capable of providing a large capacitance semiconductor integrated circuit and, in particular, DRAM.

What is claimed is:

1. A method of fabricating a semiconductor integrated circuit in which a memory cell is constituted with a memory cell selection transistor and an information storage capacitor connected in series therewith, the information storage capacitor comprises a polycrystal silicon lower electrode rugged at the surface comprising a cylindrical polycrystal silicon film having an opening at an upper portion and semi-spherical silicon crystal formed on the surface thereof, a capacitor insulative film comprising a first dielectric film comprising tantalum as a main ingredient and a second dielectric film disposed between the polycrystal silicon lower electrode and the first dielectric film, and an upper electrode formed being opposed to the polycrystal silicon lower electrode with the capacitor insulative film being disposed therebetween, wherein the method includes the steps of:

depositing an insulative film after forming the memory cell selection transistor and forming grooves by aperturing, forming an amorphous silicon film to the inside of the grooves, forming a semi-spherical silicon crystal on the surface of the silicon film, introducing phosphorus to the surface of the semi-spherical silicon crystal, forming the second dielectric film by a deposition method to the surface introduced with phosphorus, forming an amorphous tantalum pentaoxide film on the surface of the second insulation film, crystallizing the amorphous tantalum pentaoxide film in an oxidative atmosphere at 700° C. or higher, and depositing titanium nitride above the crystallized tantalum pentaoxide film so as to embed the inside of the grooves.

2. A semi conductor integrated circuit fabrication method according to claim 1, wherein the second dielectric film is an $Al_2O_3$ film which is formed by an atom layer deposition method using an organoaluminum compound and an oxidizing gas as a starting material.

3. A semiconductor integrated circuit fabrication method according to claim 2, wherein the organoaluminum compound is one of $Al(CH_3)_3$ and $Al(CH_3)_2Cl$.

4. A semiconductor integrated circuit fabrication method according to claim 2, wherein the oxidizing gas is any one of $H_2O$ and $H_2O_2$.

5. A semiconductor integrated circuit fabrication method according to claim 2, wherein the $Al_2O_3$ film is deposited to a thickness of 2.5 nm or more.

6. A semiconductor integrated circuit fabrication method according to claim 1, wherein the second dielectric film is a mixed phase of $Al_2O_3$ and $SiO_2$ and which is formed by an atom layer deposition layer method using an organoaluminum compound and silane series compound, and an oxidizing gas as the starting material.

7. A semiconductor integrated circuit fabrication method according to claim 6, wherein the organoaluminum compound is any one of $Al(CH_3)_3$ and $Al(CH_3)_2Cl$.

8. A semiconductor integrated circuit fabrication method according to claim 6, wherein the silane series compound is any one of $SiH_4$, $SiH_2Cl_2$ and $Si_2H_8$.

9. A semiconductor integrated circuit fabrication method according to claim 6, wherein the oxidizing gas is any one of $H_2O$ and $H_2O_2$.

10. A semiconductor integrated circuit fabrication method according to claim 6, wherein the mixed phase of $Al_2O_3$ and $SiO_2$ is deposited to a thickness of 2.5 nm or more.

11. A semiconductor integrated circuit fabrication method according to claim 1, wherein the second dielectric film is a $ZrSiO_4$ film which is formed by an atom layer deposition method using an organozirconium compound, a silane series compound and an oxidizing gas as the starting material.

12. A semiconductor integrated circuit fabrication method according to claim 11, wherein the organozirconium compound is any one of halogenozirconium compound such as $ZrCl_4$ and $ZrF_4$.

13. A semiconductor integrated circuit fabrication method according to claim 11, wherein the silane series compound is any one of $SiH_4$, $SiH_2Cl_2$ and $Si_2H_8$.

14. A semiconductor integrated circuit fabrication method according to claim 11, wherein the oxidizing gas is any one of $H_2O$ and $H_2O_2$.

15. A semiconductor integrated circuit fabrication method according to claim 11, wherein the $ZrSiO_4$ film is deposited to a thickness of 2.5 nm or more.

16. A semiconductor integrated circuit fabrication method according to claim 1, wherein the second dielectric film is a $HfSiO_4$ film which is formed by an atom layer deposition method using an organohafnium compound, a silane series compound and an oxidizing gas as the starting material.

17. A semiconductor integrated circuit fabrication method according to claim 16, wherein the organohafnium compound is any one of halogenohafnium compound such as $HfCl_4$ and $HfF_4$.

18. A semiconductor integrated circuit fabrication method according to claim 16, wherein the silane series compound is any one of $SiH_4$, $SiH_2Cl_2$ and $Si_2H_8$.

19. A semiconductor integrated circuit fabrication method according to claim 16, wherein the oxidizing gas is any one of $H_2O$ and $H_2O_2$.

20. A semiconductor integrated circuit fabrication method according to claim 16, wherein the $HfSiO_4$ film is deposited to a thickness of 2.5 nm or more.

21. A semiconductor integrated circuit fabrication method according to claim 1, wherein the second dielectric film is an $Si_3N_4$ film, which is deposited by a low pressure chemical vapor deposition (LPCVD) method at a temperature of 700° C. or lower using $SiH_2Cl_2$ and $NH_3$ as the starting material.

22. A semiconductor integrated circuit fabrication method according to claim 21, wherein the $Si_3N_4$ film is deposited to a thickness of 2.5 nm or more.

23. A semiconductor integrated circuit fabrication method according to claim 21, wherein the difference between the bonding energy of Si2p electrons in the $Si_3N_4$ film and the bonding energy of Si2p electron in the polycrystal silicon is larger than 2.5 eV and smaller than 3.5 eV.

* * * * *